United States Patent [19]

Sugiyama et al.

[11] Patent Number: 4,999,460
[45] Date of Patent: Mar. 12, 1991

[54] CONDUCTIVE CONNECTING STRUCTURE

[75] Inventors: Kazuhiro Sugiyama, Kunitachi; Yoshinori Atsumi, Oome, both of Japan

[73] Assignee: Casio Computer Co., Ltd., Tokyo, Japan

[21] Appl. No.: 432,135

[22] Filed: Nov. 6, 1989

[30] Foreign Application Priority Data

| | [JP] | Japan | 1-205736 |
|---|---|---|---|
| Aug. 10, 1989 | [JP] | Japan | 1-205737 |
| Aug. 15, 1989 | [JP] | Japan | 1-209638 |
| Aug. 15, 1989 | [JP] | Japan | 1-209639 |

[51] Int. Cl.⁵ .................................................. H01R 3/00
[52] U.S. Cl. ........................... 174/94 R; 174/84 R; 174/88 R; 252/512; 252/513; 252/514; 439/66
[58] Field of Search ............ 174/94 R, 84 R, 88 R; 29/868, 872, 873; 252/512, 513, 514; 439/66, 91

[56] References Cited

U.S. PATENT DOCUMENTS

| 4,113,981 | 9/1978 | Fujita et al. | 174/88 R |
|---|---|---|---|
| 4,362,903 | 12/1982 | Eichelberger et al. | 174/94 R |
| 4,425,263 | 1/1984 | Nazarenko | 252/513 X |
| 4,496,475 | 1/1985 | Abrams | 252/514 |
| 4,568,592 | 2/1986 | Kawaguchi et al. | 252/514 X |
| 4,640,981 | 2/1987 | Dery et al. | 174/88 R |
| 4,642,421 | 2/1987 | Dery et al. | 174/88 R |
| 4,731,503 | 3/1988 | Kitanishi | 174/88 R |
| 4,737,112 | 4/1988 | Jin et al. | 439/66 |
| 4,740,657 | 4/1988 | Tsukagoshi et al. | 174/94 R X |
| 4,868,637 | 9/1989 | Clements et al. | 174/88 R X |

FOREIGN PATENT DOCUMENTS 2068645A 8/1981 United Kingdom .

Primary Examiner—Morris H. Nimmo
Attorney, Agent, or Firm—Frishauf, Holtz, Goodman & Woodward

[57] ABSTRACT

A conductive connecting structure for electrically connecting first and second electronic parts each having a plurality of connecting terminals arranged at a small pitch is disclosed. A conductive bonding agent is interposed between the plurality of connecting terminals of the first and second electronic parts. The conductive bonding agent is prepared by mixing a plurality of fine connecting particles in an insulating adhesive. Each fine connecting particle is designed such that a fine conductive particle or a fine insulating particle with a plating layer formed on its surface is covered with an insulating layer consisting of a material which is broken upon thermocompression bonding. When the conductive bonding agent is subjected to thermocompression bonding between the connecting terminals of the first and second electronic parts, portions of the fine connecting particles which are urged by the respective fine connecting terminals are broken. However, the insulating layers of the fine connecting particles in the planar direction are not broken and remain as they are. In this conductive connecting structure, even if the ratio of fine connecting particles is increased, and adjacent fine connecting particles are brought into contact with each other, insulating properties can be kept in the planar direction, while conduction is obtained only in the direction of thickness.

6 Claims, 6 Drawing Sheets

CONDUCTIVE CONNECTING STRUCTURE

BACKGROUND OF THE INVENTION

1. Field of the Invention

The present invention relates to a conductive bonding agent and a conductive connecting structure.

2. Description of the Related Art

Various known methods are employed to electrically connect connecting terminals, which are spaced apart from each other, together. Soldering is one of the most commonly used methods for such a work. In order to satisfy a recent demand for a decrease in pitch of connecting terminals, the soldering techniques have been greatly improved. With the most advanced equipment and the greatest possible care, soldering can be applied to connection terminals at a pitch of about 200 $\mu$m. However, the drawbacks of this method are that connecting terminals must have a wettability for soldering and hence must be made of at least conductive metal films, and that heat-resistant insulating boards need to be used because of high-temperature bonding. These conditions raise the costs of materials.

A method using a conductive adhesive is known as a method of connecting the connecting terminals formed on an inexpensive resin board to an electronic part. In this method, however, a conductive adhesive must be accurately positioned and put on each connecting terminal. Hence, this method is very inefficient. In addition, since intervened portions between the connecting terminals are not coated with adhesive, i.e., impossible to be bonded, only the connecting terminals are bonded with extremely low bonding strength, thereby reinforcing means for increasing the bonding strength is required. For this reason, the bonding portions occupy a large volume. In addition to these drawbacks, when the pitch of connecting terminals becomes 200 to 300 $\mu$m or less, the frequency of short circuit and conduction failure is increased due to positioning with poor precision accompanying connecting operations.

As another conventional technique, a method using an anisotropic conductive adhesive is available, which is relatively close to the principle of the present invention, in comparison with the above-described method. An anisotropic conductive adhesive is obtained by dispersing fine conductive particles in an insulating adhesive. When the connecting terminals of a board are to be connected to the connecting terminals of an electronic part by using the anisotropic conductive adhesive, the adhesive is coated not only on the connecting terminals formed on the board and the electronic part, but also on intervened portions of the board and the electronic part between the connecting terminals. When the connecting terminals of the board and those of the electronic part are bonded together with the anisotropic conductive adhesive with heat and pressure, the respective fine conductive particles and the insulating adhesive located at the connecting terminals partially flows to intervened portions between the connecting terminals. The connecting terminals of the board and the electronic part are brought into direct contact with the fine conductive particles. In this case, if the respective fine conductive particles even after they flow to intervening portions between the connecting terminals, are located to be sufficiently separated respectively, so as not to make contact with each other, the connecting terminals formed on the board and the electronic part are free from short circuits. That is, an anisotropic conductive adhesive is an adhesive which has an electric conductivity in the direction of thickness and insulating properties in the planar direction, i.e., has a directional electric conductivity. U.S. Pat. No. 4,113,981 and GB 2068645A disclose such anisotropic conductive adhesives, and may be referred to for easy understanding thereof.

Since this anisotropic conductive adhesive contains a material, as an insulating adhesive, which melts at a relatively low temperature of 100° to 200° C., it can be applied to a resin board. In addition, when the anisotropic conductive adhesive is to be coated on the connecting terminals of a board, no accurate positioning work is required, and hence an effective operation can be performed. Moreover, since the adhesive is also interposed between the connecting terminals, the bonding strength can be increased.

As described above, it is absolutely essential for an anisotropic conductive adhesive to exhibit conductivity in the direction of thickness and insulating properties in the planar direction. In order to obtain conductivity in the direction of thickness, at least (theoretically) one fine conductive particle must be interposed between each connecting terminal of a board and a corresponding connecting terminal of an electronic part. In order to obtain insulating properties in the planar direction, every fine conductive particle is ideally separated from adjacent particles by insulating adhesive filled up thereof, so as not to be electrically conductive to each other. A part of adjacent fine conductive particles is allowed to make contact with each other, provided all of them are insulated from the adjacent connecting terminals. However, there is no guarantee that every conductive particle is insulated from the adjacent connecting terminals. Therefore, the anisotropic conductive adhesive needs to have a structure allowing no conduction between any adjacent fine conductive particles.

In an anisotropic conductive adhesive, however, the arrangement of fine conductive particles dispersed in an insulating adhesive is determined simply by the manner of stirring. For this reason, the distribution of the fine conductive particles inevitably becomes nonuniform, having dense and sparse portions. Therefore, such an anisotropic conductive adhesive can be used, provided that fine conductive particles in a dense portion are not conductive each other and at least one fine to particle is positioned to one connecting terminal in a sparse portion.

In proportion to a decrease in pitch of connecting terminals, and hence a decrease in width of each connecting terminal, the above-described conditions become more difficult to satisfy. The number of fine conductive particles located on one connecting terminal is decreased with a decrease in width of the connecting terminal. If the ratio of fine conductive particles mixed in the insulating adhesive is increased in order to increase the number of fine conductive particles located on each connecting terminal, the density of fine conductive particles in each dense portion is further increased. As is apparent, if intervened portions between connecting terminals, in the dense portions, are filled with fine conductive particles, the circuit is shorted.

Because of the above-described structure and function, the connecting method using an anisotropic conductive adhesive is theoretically applicable to the connection of connecting terminals at a pitch several times the diameter of a fine conductive particle. In practice, however, the actual application of this method is far from the theoretical assumption. If, for example, fine conductive metal particles each having a diameter of about 10 to 20 μm are used, the pitch of connecting terminals can be only reduced to 200 to 300 μm. In this case, the mixing ratio of the fine metal particles is about 15% in weight ratio. As long as this method is employed, practically as well as theoretically, an anisotropic conductive adhesive cannot be applied to the connection of connecting terminals having a pitch smaller than the diameter of a fine conductive particle.

SUMMARY OF THE INVENTION

The present invention has been made in consideration of the above situation, and has as its object to provide a new and improved conductive connecting structure, in which low-temperature bonding of connecting terminals can be performed so as to allow the use of any wiring materials and board materials, and which can be applied to the connection of connecting terminals having a pitch much smaller than that of connecting terminals in a conventional structure.

In order to achieve the above object, according to the present invention, there is provided a conductive connecting structure comprising a first connecting terminal, a second connecting terminal arranged to oppose the first connecting terminal, a plurality of fine connecting particles interposed between the first and second connecting terminals, each of the fine connecting particles including a fine particle having an electric conductivity at least in a surface thereof, and an insulating layer consisting of a material having a relatively low melting point and covering substantially the entire surface of the fine particle, and an insulating adhesive filled in a gap between the first and second connecting terminals, wherein only portions of the insulating layer covering the surface of each fine particle which oppose the first and second connecting terminals are broken, and the first and second connecting terminals are electrically connected each other through the particle exposed from the broken portions.

BRIEF DESCRIPTION OF THE DRAWINGS

These and other objects and features of the present invention will be better understood from the following detailed description taken in conjunction with the accompanying drawings, in which.

Detailed Description of the Preferred Embodiments

(Basic Constitution of the Invention)

The problem of an anisotropic conductive adhesive is that the ratio of fine conductive particles which can be mixed in an insulating adhesive cannot be set to exceed a predetermined value in order to electrically insulate the fine conductive particles from each other. Therefore, if it is guaranteed that the fine conductive particles are not electrically connected to each other, the above problem can be solved. That is, by sufficiently increasing the ratio of fine conductive particles, a sufficiently large number of fine conductive particles necessary for conduction can be positioned on each connecting terminal, no matter how small the width of each connecting terminal becomes. Furthermore, in this case, no matter how densely fine conductive particles are distributed between connecting terminals, the connecting terminals are free from short circuiting as long as the fine conductive particles are not electrically connected to each other.

A conductive bonding agent used in a conductive connecting structure of the present invention includes fine connecting particles to be mixed in an insulating adhesive. Each fine connecting particle is designed such that a conductive film is formed on the surface of a fine insulating particle, and the surface of the conductive film is coated with a resin layer so as to electrically insulate it from the outside entirely or partially. In this case, to electrically insulate the surface of the conductive layer from the outside entirely or partially is to prevent conduction between the conductive films of the fine connecting particles. Therefore, the fine connecting particles of the present invention exhibit the above-described function.

If electrical conduction in the direction of thickness of such a conductive bonding agent can be achieved, such a conductive connecting structure can be applied to connecting terminals which are arranged at any small pitch. For this purpose, the resin layer of each fine connecting particle of the present invention is composed of a low-melting material, and is designed such that a portion in the direction of thickness is broken due to a thermocompression force acting on the bonding agent, and a portion in the planar direction remains.

Because of the fine connecting particles included in the conductive bonding agent, therefore, the conductive connecting structure of the present invention has conductivity in the direction of thickness of the bonding agent, but has insulating properties in the direction in which the fine connecting particles are arranged, i.e., the planar direction after it is connected by means of a thermocompression bonding jig or the like.

(Embodiments)

Embodiments of the present invention will be described below with reference to the accompanying drawings.

Figure 1:
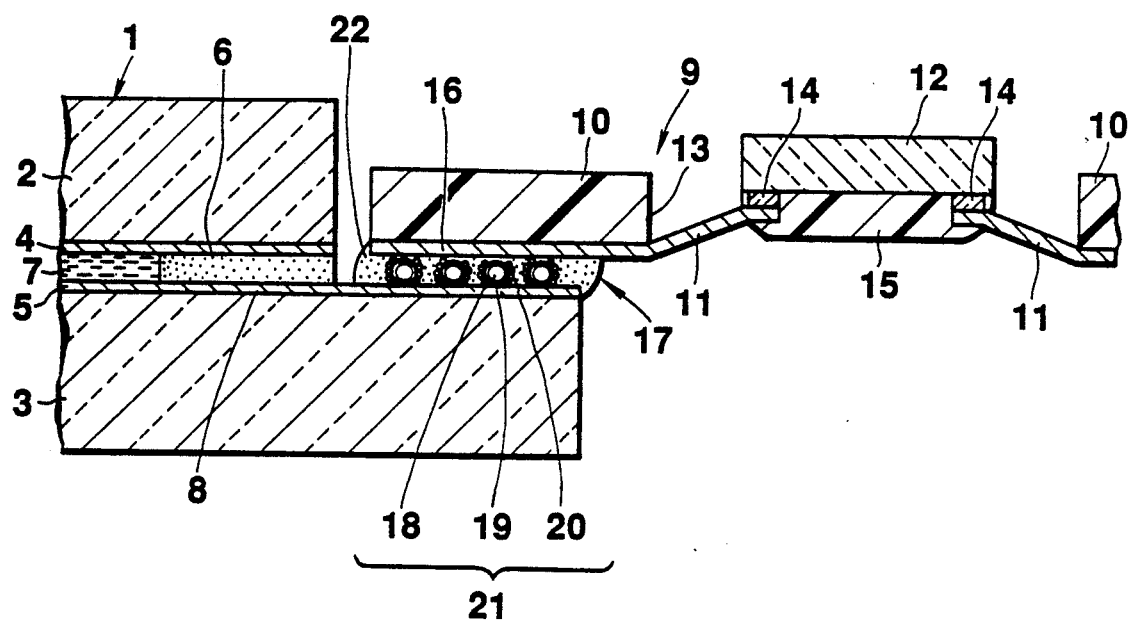
FIG. 1 is an enlarged sectional view showing a main portion of a structure in which a liquid crystal display panel and a film board are connected to each other by using a conductive bonding agent of the present invention.

FIG. 1 shows a conductive connecting structure applied to the connection between a liquid crystal display panel and a film board by means of a conductive bonding agent of the present invention. A liquid crystal display panel 1 is designed such that transparent electrodes 4 and 5 consisting of ITO (Indium Tin Oxide) or the like are formed on the opposite surfaces of a pair of upper and lower glass boards 2 and 3, a seal member 6 is arranged between the peripheral portions of the transparent electrodes 4 and 5, and a liquid crystal 7 is sealed in the space defined by the seal member 6. In this case, the upper and lower transparent electrodes 4 and 5 are connected to a connecting terminal 8 which is formed on the lower glass board 3 so as to laterally protrude from the upper glass board 2. Note that the connecting terminals 8 are arranged at equal intervals so as to correspond to the upper and lower transparent electrodes in number, respectively. A film board 9 is designed such that finger leads 11 are formed on the lower surface of a carrier tape 10 by a TAB (Tape Automated Bonding) scheme, and an IC chip 12 is connected to the finger leads 11. More specifically, bumps 14 of the IC chip 12 are respectively bonded to the inner end portions of the finger leads 11 protruding into an opening of the carrier tape 10. In this case, a heater chip (not shown) is heated at a high temperature of 400° to 500° C. so as to bond the finger leads 11 to the bumps 14, respectively, by thermocompression bonding. After this operation, the bonding surface of the IC chip 12 is sealed by a resin 15. Note that each finger lead 11 is formed by etching a metal film, such as a copper film, laminated on the carrier tape 10. The outer end portion of each finger lead 11 constitutes a connecting terminal 16. Connection terminals 16 are arranged at equal intervals so as to correspond to the connecting terminals 8 of the liquid crystal display panel 1 in number.

Figure 2:
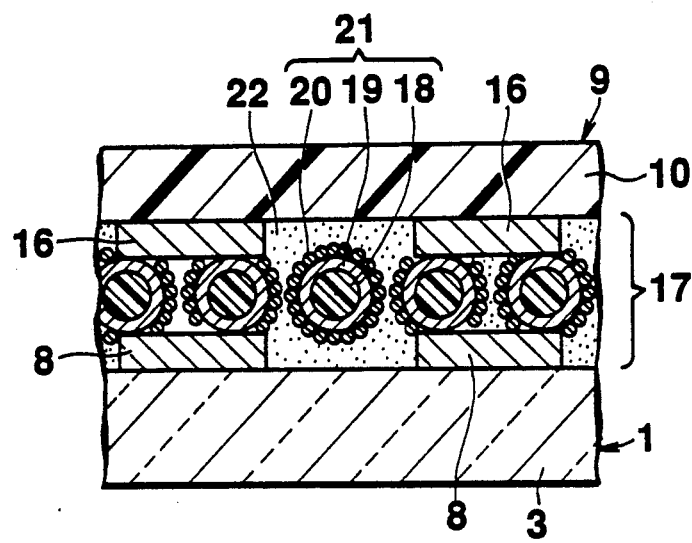
FIG. 2 is an enlarged sectional view of a main portion of the structure in FIG. 1, showing a bonding state of connecting terminals by means of the conductive bonding agent.

The connecting terminals 8 of the liquid crystal display panel 1 and the connecting terminals 16 of the film board 9 are connected each other by using a conductive bonding agent 17. More specifically, as shown in FIGS. 1 and 2, the conductive bonding agent 17 is designed such that fine connecting particles 21 are formed by forming conductive films 19 on the surfaces of fine resin particles 18 and covering the outer surfaces of the conductive films 19 with resin layers 20 for electrically insulating them, and the fine connecting particles 21 are mixed in an insulating adhesive 22 so as to be in contact with each other. In this case, each fine resin particle 18 is made of an acrylic resin or the like. Each conductive film 19 is obtained by forming a metal film, such as gold, silver, copper, nickel, or aluminum, by electro-plating or vapor deposition. Each resin layer 20 serves to electrically insulate the outer surface of a corresponding conductive film 19, and is formed by causing particles of a fine micro insulating powder having a low melting point (about 100° to 200° C.) to adhere to the surface of the conductive film 19 with an electrostatic effect, i.e., Coulomb force. Note a fine powder is far finer than the fine micro resin particle 18. The fine connecting particle 21 obtained by covering the conductive film 19 of such a fine resin particle 18 with the resin layer 20 can be formed to have a diameter of about 10 μm. The insulating adhesive 22 is preferably constituted by a hot-melt type adhesive consisting of a thermoplastic resin which melts at 100° to 200° C. However, the insulating adhesive 22 is not limited to this but may be constituted by a thermosetting resin.

FIG. 2 shows a state wherein the connecting terminals 8 and 16 are connected using the conductive bonding agent 17. The conductive bonding agent 17 is arranged between the connecting terminals 8 of the glass board 3 of the liquid crystal display panel 1 and the connecting terminals 16 of the film board 9, and is subjected to thermocompression bonding by means of a heater chip (not shown). As a result, the glass board 3 and the film board 9 are bonded together with the insulating adhesive 22. At the same time, the opposite connecting terminals 8 and 16 are electrically connected with the fine connecting particles 21. More specifically, the fine connecting particles 21 located between the connecting terminals 8 and 16 are clamped therebetween and heated. As a result, portions in the direction of thickness of the resin layers with which the connecting terminals 8 and 16 are brought into contact melt and flow, and the conductive films 19 respectively formed on the surfaces of the fine resin particles 18 are exposed and brought into contact with the connecting terminals 8 and 16 so as to be conductive thereto. However, since portions in the planar direction of the resin layers 20 with which the connecting terminals 8 and 16 are not brought into contact are subjected to a small pressure compared with the pressure in the direction of thickness, they remain as they are. Note that since the fine connecting particles 21 arranged between the adjacent connecting terminals 8 or 16 are not clamped by the connecting terminals 8 and 16, their resin layers 20 remain unchanged. Therefore, the conductive films 19 respectively formed on the fine resin particles 18 are not rendered conductive in the direction in which the connecting terminals 8 and 16 are arranged, but are brought into contact with only the opposite connecting terminals 8 and 16 so as to be rendered conductive. As a result, the adjacent connecting terminals 8 and 16 are not rendered electrically conductive to each other, but only the opposite connecting terminals 8 and 16 are reliably connected together. In this case, even if the pitch of the connecting terminals 8 (16) is smaller than the size of the fine connecting particle 21, the respective connecting terminals 8 (16) are not rendered conductive to the adjacent terminals 8 (16), but only the connecting terminals 8 ca be connected to the connecting terminals 16 (8) respectively faced terminals 8 (16). This will be described below.

Figure 3:
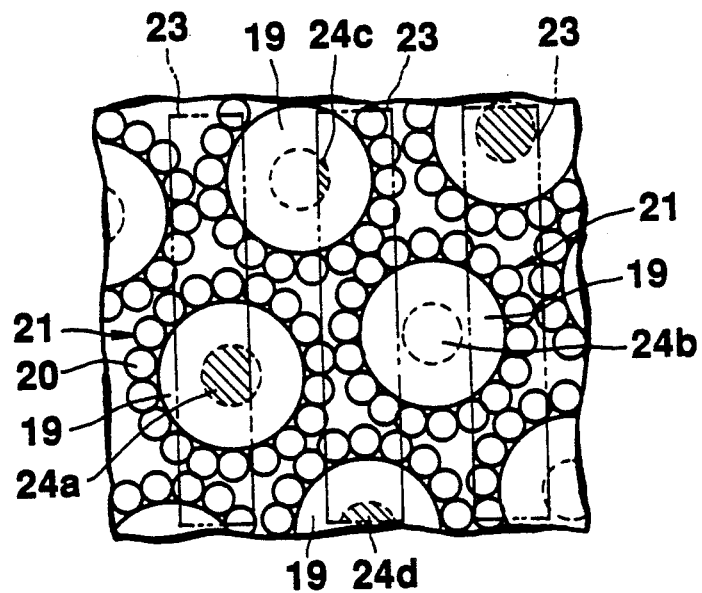
FIG. 3 is a plan view for explaining a conductive function of the conductive bonding agent in FIG. 2.

FIG. 3 shows a relationship in conduction between connecting terminals 23 and the fine connecting particles 21, in which the pitch of the connecting terminals 23 is smaller than the size of each fine connecting particle 21. Referring to FIG. 3, circles 24a to 24d indicated by dotted lines at the centers of the respective fine connecting particles 21 correspond to portions of the resin layers 20 to be melted by thermocompression bonding. Hence, these regions are brought into contact with the connecting terminals 23. The connecting terminals 23 indicated by alternate long and short dashed lines correspond to the connecting terminals 8 and 16 in FIG. 2. In this case, the width of each connecting terminal 23 is set to be about ½ the outer diameter of the conductive film 19 formed on the surface of each fine resin particle 18. The pitch of the connecting terminals 23 is set to be substantially equal to the outer diameter of each conductive film 19, and the length of each connecting terminal 23 is set to be about twice that of each fine connecting particle 21. In addition, the fine connecting particles 21 are arranged such that the adjacent particles are in contact with each other without a gap. The fine connecting particles 21 are arranged in the same manner in the longitudinal direction of the connecting terminal 23 as well as in the pitch direction. The conductive film 19 of the fine resin particle 18 located at the lower left side in FIG. 3 is in contact with the connecting terminal 23 at a hatched portion indicated in the contact region 24a. The contact region 24b of the conductive film 19 on the right side of the region 24a does not overlap the connecting terminal 23 on the right side of the region 24a, and hence is not brought into contact therewith. However, parts of the contact regions 24c and 24d of the conductive films 19 of the fine resin particles 18 located before and behind the fine connecting particle located at the lower left side in FIG. 3 and the particle 21 on the right side thereof are brought into contact with the front and rear portions of the connection terminal 23 on the right side of the region 24a, as indicated by hatched lines. This is because the fine connecting particles 21 are arranged in contact with each other, and the conductive films 19 of the fine resin particles 18 located before and behind the regions 24a and 24b are placed between the conductive film 19 of the fine resin particle 18 on the lower left side in FIG. 3 and the conductive film 19 of the fine resin particle 18 on the right side thereof.

As described above, even if the width and the pitch of the connecting terminals 23 are set to be smaller than the size of the fine connecting particle 21, only the opposite connecting terminals 23 can be connected while rendering the adjacent terminals 23 insulated from each other. In practice, since the connecting terminal 23 is far longer than the fine connecting particle 21, a large number of fine connecting particles 21 are arranged in the longitudinal direction of the connecting terminal 23. Therefore, the above-described connection can be further ensured. Even if, for example, the length of each connecting terminal 23 is set to be 1 mm, fine connecting particles 21 each having a diameter of about 10 μm can be arranged in the longitudinal direction in about 100 rows. In addition, the fine connecting particles 21 arranged in 100 rows are slightly offset from each other in the pitch direction. Therefore, this bonding agent can be theoretically applied to connecting terminals arranged at a pitch smaller than the diameter of each fine connecting particle 21.

Figure 4:
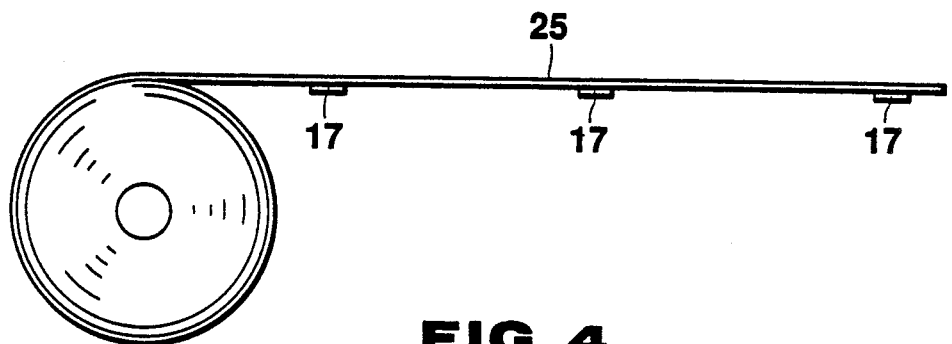
FIG. 4 is a side view showing a process of coating the conductive bonding agent on a transfer sheet.
Figure 5:
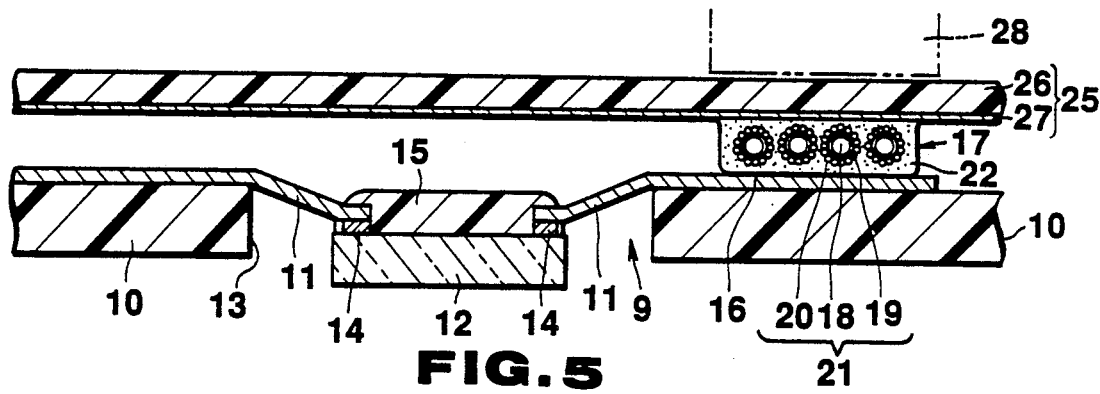
FIG. 5 is a sectional view showing a process of transferring the conductive bonding agent of the transfer sheet onto the film board.
Figure 6:
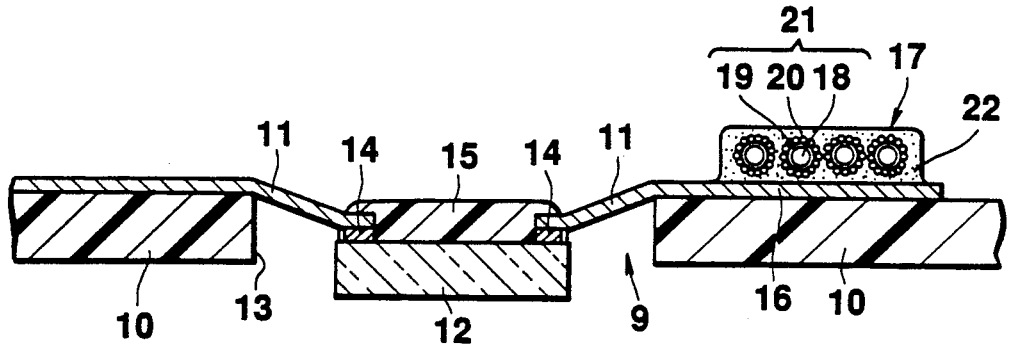
FIG. 6 is a sectional view showing a state wherein the conductive bonding agent is transferred on the film board.
Figure 7:
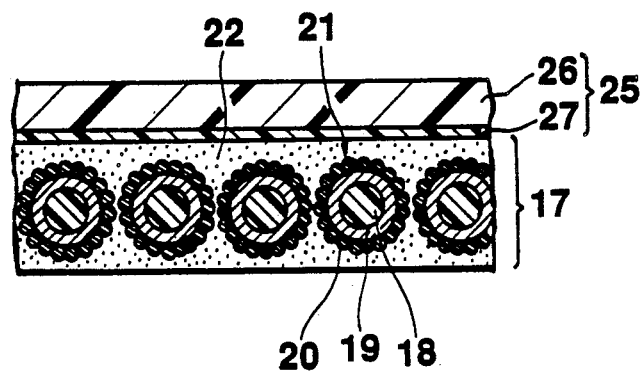
FIG. 7 is an enlarged sectional view showing a main part of a state wherein the conductive bonding agent is coated on the transfer sheet.

FIGS. 4 to 7 show the processes of forming the above-described conductive bonding agent 17 on each connecting terminal 16 of the film board 9 and connecting the film board 9 to the liquid crystal display panel 1. As shown in FIG. 4, a transfer sheet 25 which is wound in the form a roll is extracted, and the conductive bonding agent 17 is applied in each predetermined portion of the lower surface of the sheet 25. The transfer sheet 25, as shown in FIG. 7, is prepared by forming a peel layer 27 on the lower surface of a flexible tape-like base sheet 26. The conductive bonding agent 17 is formed on the peel layer 27. This conductive bonding agent 17 is prepared by dispersing the fine connecting particles 21 in the insulating adhesive 22 with the particles 21 being two-dimensionally arranged in contact with each other as described above. The conductive bonding agent 17 is coated on the peel layer 27 by means of printing, such as screen printing, and is dried to be hardened.

Each conductive bonding agent 17 of the transfer sheet 25 is positioned to correspond to the connecting terminal 16 of the film board 9. In this case, since the transfer sheet 25 is flexible, even if the IC chip 12 is connected to the film board 9 in advance, each conductive bonding agent 17 can be easily positioned to the connecting terminal 16 of the film board 9.

When thermocompression bonding is performed by bringing a heater chip 28 into contact with the upper surface of the transfer sheet 25 shown in FIG. 5, the conductive bonding agent 17 is thermally transferred onto the connecting terminal 16 of the film board 9 with the heat generated by the heater chip 28. In this case, thermocompression bonding is performed at a temperature lower than the temperature of bonding of the IC chip 12 described above. When the conductive bonding agent 17 is transferred onto the film board 9, the conductive bonding agent 17 is peeled off from the peel layer 27 of the transfer sheet 25, as shown in FIG. 6, thereby transferring only the conductive bonding agent 17 onto the connecting terminal 16 of the film board 9.

In the above-described embodiment, the conductive bonding agent 17 on the transfer sheet 25 is formed beforehand into a shape to be transferred, and is transferred onto the film board 9 by thermocompression bonding. However, if the thermocompression bonding surface of the heather chip 28 is formed into the shape to be transferred, the conductive bonding agent 17 may be coated on the entire surface of the transfer sheet 25, and thermocompression bonding of the heater chip 28 is performed to melt only a portion of the conductive bonding agent 17 corresponding to the thermocompression bonding surface of the heater chip 28 and transfer it onto the film board 9.

Subsequently, as shown in FIG. 1, the film board 9 is reversed, and each connecting terminal 16 is positioned to correspond to a connecting terminal 8 of the liquid crystal display panel 1 through the conductive bonding agent 17 When thermocompression bonding is performed in this state, the film board 9 and the liquid crystal display panel 1 are bonded together, besides the connecting terminals 8 are electrically connected to the terminals 16 respectively faced to the terminals 8, through the conductive films 19 of the fine connecting particles 21.

In such a connecting structure of the liquid crystal display panel 1 and the film board 9, therefore, bonding can be easily performed by simply arranging the conductive bonding agent 17 between the connecting terminals 8 and 16 respectively facing each other and performing thermocompression bonding by using a heater chip or the like. In this case, even if the number of connecting terminals 8 and 16 in an area is increased to get a finer pitch, only the opposite connecting terminals can be reliably connected to while rendering the adjacent connecting terminals insulating each other.

Figure 8:
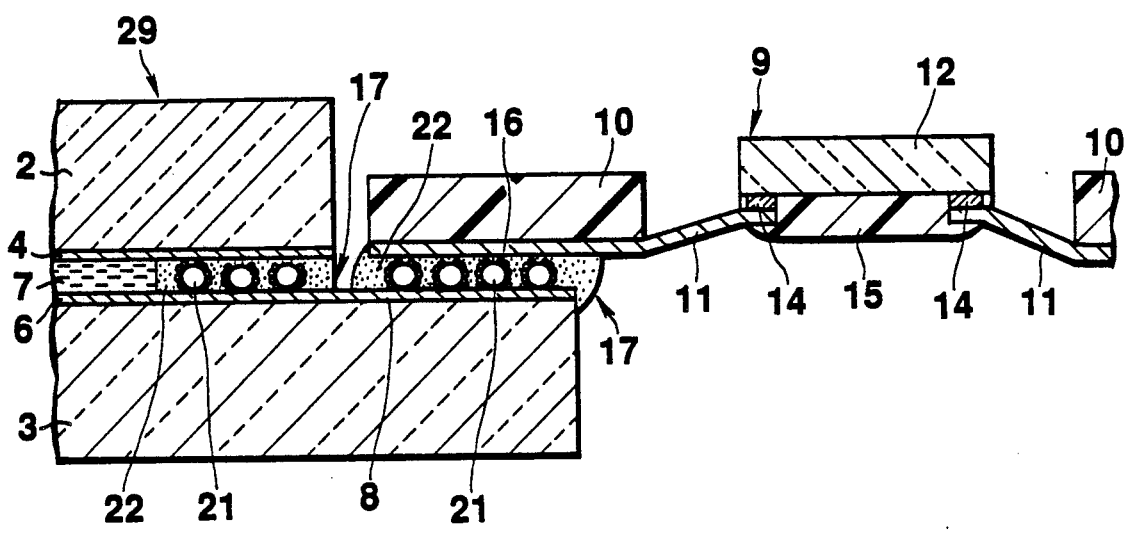
FIG. 8 is an enlarged sectional view showing a main part of a liquid crystal display panel using the conductive bonding agent.

FIG. 8 shows a case wherein the conductive connecting structure of the present invention is applied to the connection of one of opposite transparent electrodes 4 and 5 of a liquid crystal display panel 29 to connecting terminals 8 by using the above-described bonding agent 17. Similar to the above-described embodiment, in this liquid crystal display panel 29, a liquid crystal 7 is sealed by a seal member (not shown) between a pair of glass boards 2 and 3 with the transparent electrodes 4 and 5 arranged on their opposite surfaces. Part of the seal member is constituted by the conductive bonding agent 17. More specifically, when the conductive bonding agent 17 is arranged between the glass boards 2 and 3 and is subjected to thermocompression bonding, the upper and lower glass boards 2 and 3 are bonded together with the insulating adhesive 22, as described above. At the same time, fine connecting particles 21 reliably connect the upper transparent electrodes 4 to the connecting terminals of the lower glass board 3, while preventing conduction between the adjacent connecting terminals 8. Note that such a liquid crystal display panel 1 can also be bonded to the film board 9 with the conductive bonding agent 17 in the same manner as the liquid crystal display panel 1 shown in FIG. 1.

Figure 9:
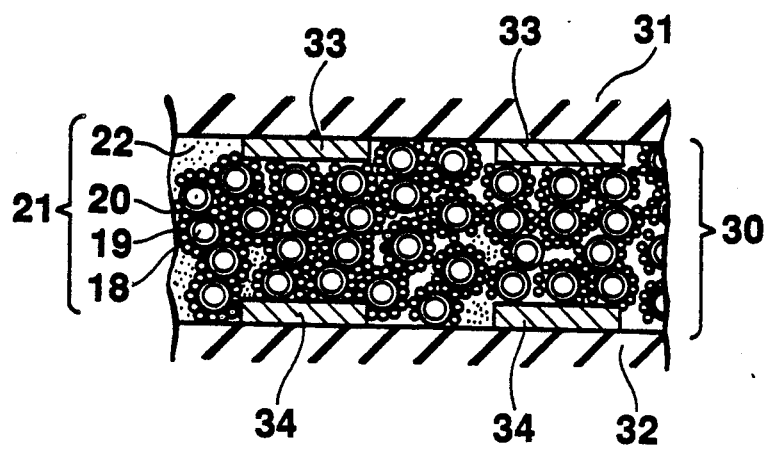
FIGS. 9 to 12 are enlarged sectional views respectively showing conductive connecting structures according to other embodiments of the present invention.

FIG. 9 shows the first modification of the conductive bonding agent. A conductive bonding agent 30 is prepared by mixing fine connecting particles 21 in an insulating adhesive 22 so as to be stacked in the direction of thickness. When this conductive bonding agent 30 is applied between boards 31 and 32, the fine connecting particles 21 are stacked in the direction of thickness, while the insulating adhesive 22 is filled in gaps between the particles 21. With this structure, when the upper and lower boards 31 and 32 are subjected to thermocompression bonding, the boards 31 and 32 are bonded together with the insulating adhesive 22, while connecting terminals 33 and 34 respectively arranged to oppose the upper and lower boards 31 and 32, are electrically connected to each other upon conduction between the fine connecting particles 21 arranged therebetween in the direction of thickness. More specifically, since the upper and lower portions of the fine connecting particles 21 arranged between the opposite connecting terminals 33 and 34 in the direction of thickness are pressed upon thermocompression bonding, resin layers 20 of these portions are broken, and conductive films 19 of upper and lower fine resin particles 18 are rendered conductive to each other. However, since resin layers 20 of the fine connecting particles 21 adjoining each other in the planar direction are not broken and remain as they are, conductive films 19 of fine resin particles 18 adjoining each other in the planar direction are not rendered conductive to each other. As a result, of the connecting terminals 33 and 34, only the opposite connecting terminals 33 and 34 are reliably connected while rendering the adjacent connecting terminals 33 and 34 insulated from each other.

Figure 10:
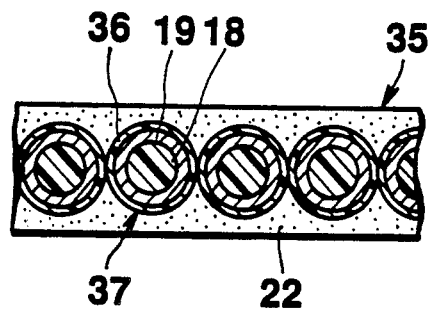

FIG. 10 shows the second modification of the conductive bonding agent. A conductive bonding agent 35 is prepared in such a manner that fine connecting particles 37 are formed by coating low-melting insulating resin layers 36 on the outer surfaces of conductive films 19 of fine resin particles 18 so as to form thin films, and the fine connecting particles 37 are mixed in an insulating resin 22 in contact with each other. Similarly, in this conductive bonding agent 35, the resin layers 36 in the direction of thickness are broken upon thermocompression bonding to expose the conductive films 19 of the fine resin particles 18, whereas the resin layers 36 in the planar direction perpendicular to the direction of thickness are not broken. Hence, the same effects as that of those above-described conductive bonding agent can be obtained.

Figure 11:
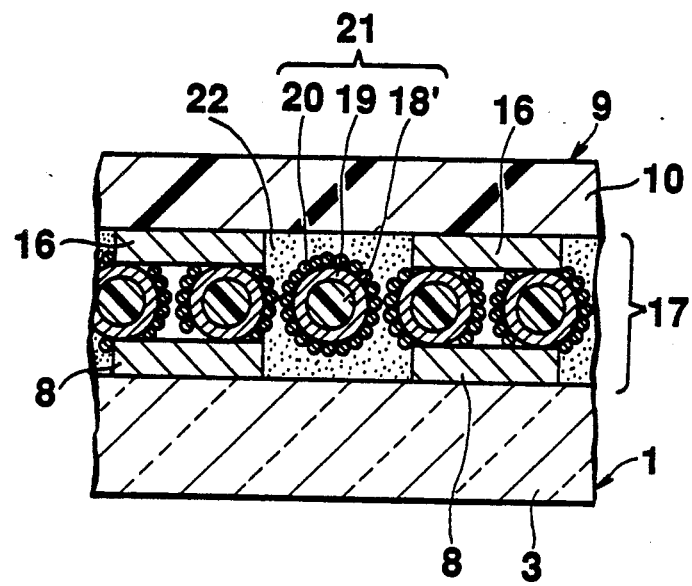

Materials other than a synthetic resin may be used for fine connecting particles. FIG. 11 shows fine connecting particles 21 according to another embodiment of the present invention. In this embodiment, an inorganic material such as silicon oxide ($SiO_2$) or titanium oxide ($TiO_2$) is used for a fine particle 18'. Since the inorganic material is not deformed upon thermocompression bonding, a resin layer 20 adhering to the surface of the fine particle 18' can be reliably broken. In addition, the particle 18' consisting of such an inorganic material serves to maintain the distances between the connecting terminals 8 and 16 constant. However, since the fine particle 18' has no springback, unlike the fine resin particle 18, differences in thermal expansions between the connecting terminals 8 and 16 are less absorbed. In addition, if the conductive bonding agent containing the fine particles 18' is applied to an electronic part in which a semiconductor element layer is formed under a very thin connecting terminal such as a connecting terminal of a solar cell, the semiconductor element layer may be broken. Therefore, whether to use the fine resin particles 18 or the inorganic fine particles 18' should be determined after the respective characteristics are carefully considered.

Figure 12:
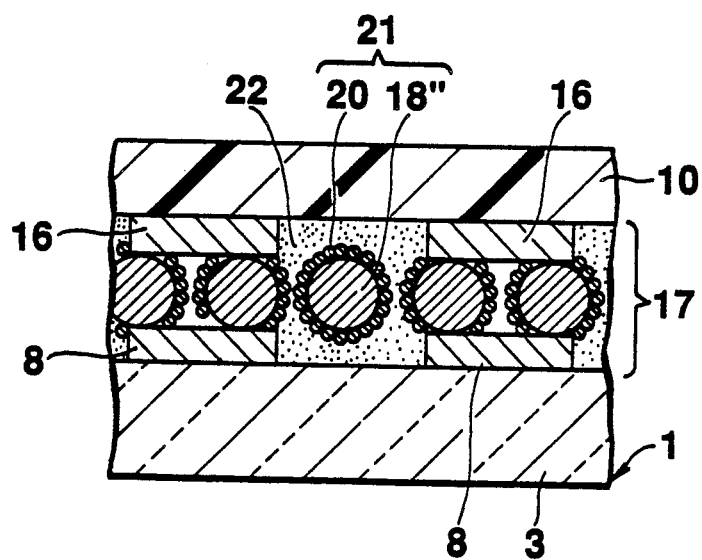

FIG. 12 shows a case wherein a metal material is used for a fine particle 18''. As a metal material, gold, silver, nickel, copper, tin, aluminum, or the like can be suitably used. Since a metal material has conductivity, a resin layer 20 can be directly formed on the surface of each fine metal particle 18'' without forming a conductive film 19.

Since members used for the bonding agents shown in FIGS. 11 and 12 are the same as those in FIG. 2 except for the above-described members, the same reference numerals in FIGS. 11 and 12 denote the same parts as in FIG. 2, and a description thereof is omitted.

Note that the ratio of fine connecting particles to be mixed in an insulating adhesive need not be set to such a degree that adjacent fine connecting particles are brought into contact with each other. In a conventional anisotropic conductive adhesive, the mixing ratio of conductive particles is set to be about 15 wt % when only metal particles are used, and is set to be about 2 wt % when metal layers are formed on resin particles.

The present invention is characterized in that the mixing ratio of fine connecting particles can be set to be much larger than that of the above-described conductive particles. The upper limit of this mixing ratio is not specified as long as bonding strength is ensured.

In addition, the present invention is characterized in that the conductive bonding agent can be suitably used even if the mixing ratio of fine connecting particles is set to be equal to that of fine conductive particles in the conventional anisotropic conductive adhesive. That is, the greatest advantage of the present invention is that an optimal connecting structure can be obtained in accordance with the pitch of connecting terminals of an electronic part to be connected, the surface treatment of a connecting portion, the weight of the electronic part, and a mounting structure.

As has been described above, the conductive connecting structure of the present invention can be applied when the pitch of connecting terminals is far smaller than that in the conventional connecting structure. In addition, since each fine connecting particle is not insulated by an insulating adhesive but has its own insulating layer, short circuiting of connecting terminals can be reliably prevented.

Moreover, since low-temperature bonding can be performed, the conductive connecting structure of the present invention can be applied to connecting terminals or insulating boards consisting of inexpensive materials. In spite of a small pitch of connecting terminals, reliable connection can be realized.

What is claimed is:
1. A conductive connecting structure, comprising:
   a first connecting terminal;
   a second connecting terminal arranged to oppose said first connecting terminal;

a plurality of fine connecting particles interposed between said first and said second connecting terminals, each of said fine connecting particles including a fine insulating particle having an electric conductive layer on an outer surface thereof, and an insulating layer comprising a material having a relatively low melting point and covering substantially the entire surface of said fine insulating particle; and an insulating adhesive filled in a gap between said first and said second connecting terminals, wherein only portions of said insulating layer covering the surface of said fine insulating particle of each said fine connecting particles which oppose said first and said second connecting terminals are broken, and said first and said second connecting terminals are electrically connected to each other through said fine connecting particles via the conductive layer as exposed from the broken portions of each of said insulating layer.

2. A structure according to claim 1, wherein said insulating layer consists of a large number of micro-powder particles each of which is smaller than said fine insulating particle.

3. A structure according to claim 2, wherein said fine insulating particle and said large number of micro-powder particles are coupled to each other by Coulomb force.

4. A structure according to claim 1, wherein said fine insulating particle comprises a micro-powder consisting of an organic material, and a conductive layer covering a surface of said fine insulating particle.

5. A structure according to claim 1, wherein said fine insulating particle comprises a micro-powder consisting of an inorganic material, and a conductive layer covering a surface of said fine insulating particle.

6. A structure according to claim 1, wherein said fine connecting particles are arranged at intervals at which adjacent fine connecting particles are substantially in contact with each other.

* * * * *

UNITED STATES PATENT AND TRADEMARK OFFICE
CERTIFICATE OF CORRECTION

PATENT NO. : 4,999,460

DATED : March 12, 1991

INVENTOR(S) : SUGIYAMA et al

It is certified that error appears in the above-identified patent and that said Letters Patent is hereby corrected as shown below:

On the title page:

Section [30] Foreign Application Priority Data, the priority date of Japanese application 1-205736 is:

--August 10, 1989--.

Signed and Sealed this

Sixth Day of April, 1993

*Attest:*

STEPHEN G. KUNIN

*Attesting Officer*   Acting Commissioner of Patents and Trademarks